(12) United States Patent
Nakagawa et al.

(10) Patent No.: US 7,964,868 B2
(45) Date of Patent: Jun. 21, 2011

(54) SEMICONDUCTOR LIGHT-EMITTING DEVICE AND METHOD OF MANUFACTURING THE SAME

(75) Inventors: Akira Nakagawa, Morioka (JP); Yasube Kashiwaba, Morioka (JP); Ikuo Niikura, Yokohama (JP)

(73) Assignees: Citizen Tohoku Co., Ltd., Kitakami-shi (JP); Incorporated National University Iwate University, Morioka-shi (JP)

( * ) Notice: Subject to any disclaimer, the term of this patent is extended or adjusted under 35 U.S.C. 154(b) by 432 days.

(21) Appl. No.: 12/065,795

(22) PCT Filed: Sep. 5, 2006

(86) PCT No.: PCT/JP2006/317569
§ 371 (c)(1),
(2), (4) Date: Mar. 5, 2008

(87) PCT Pub. No.: WO2007/029711
PCT Pub. Date: Mar. 15, 2007

(65) Prior Publication Data
US 2009/0267063 A1 Oct. 29, 2009

(30) Foreign Application Priority Data

Sep. 6, 2005 (JP) ................................. 2005-257781

(51) Int. Cl.
*H01L 29/10* (2006.01)
(52) U.S. Cl. ... 257/43; 257/103; 257/102; 257/E33.019; 257/E33.013; 257/E21.461; 438/45; 438/104
(58) Field of Classification Search ............... 257/43, 257/103, 102, E33.019, E33.013, E21.461, 257/6, 250; 438/45, 104
See application file for complete search history.

(56) References Cited

U.S. PATENT DOCUMENTS

| 2002/0084455 A1* | 7/2002 | Cheung .......................... 257/43 |
| 2003/0146433 A1* | 8/2003 | Cantwell et al. ................ 257/43 |
| 2005/0020035 A1* | 1/2005 | Nause et al. ................... 438/478 |
| 2005/0199885 A1* | 9/2005 | Hata et al. ...................... 257/79 |

FOREIGN PATENT DOCUMENTS

| JP | 2002-326895 A | 11/2002 |
| JP | 2003-282434 A | 10/2003 |
| JP | 2004-221132 A | 8/2004 |
| JP | 2004-221352 A | 8/2004 |
| JP | 2004-247411 A | 9/2004 |
| JP | 2004-296821 A | 10/2004 |
| JP | 2004-247681 A | 9/2007 |

OTHER PUBLICATIONS

Translation of International Preliminary Report on Patentability mailed Mar. 20, 2008 of International Application No. PCT/JP2006/317569.
International Search Report of PCT/JP2006/317569, date of mailing Dec. 12, 2006.
Decision to Grant a Patent dated Jul. 19, 2010, issued in corresponding Korean Patent Application No. 10-2008-7006091.

* cited by examiner

*Primary Examiner* — Tu-Tu V Ho
(74) *Attorney, Agent, or Firm* — Westerman, Hattori, Daniels & Adrian, LLP

(57) ABSTRACT

Disclosed is a semiconductor light-emitting device wherein a pn junction is formed by forming, as a p-type layer (11), a semiconductor thin film which is composed of a ZnO compound doped with nitrogen on an n-type ZnO bulk single crystal substrate (10) whose resistance is lowered by being doped with donor impurities. It is preferable to form the p-type layer (11) on a zinc atom containing surface of the n-type ZnO bulk single crystal substrate (10).

7 Claims, 5 Drawing Sheets c(0001) SURFACE, Zn SURFACE m(10-10) SURFACE a(11-20) SURFACE

US 7,964,868 B2

SEMICONDUCTOR LIGHT-EMITTING DEVICE AND METHOD OF MANUFACTURING THE SAME

TECHNICAL FIELD

The present invention relates to a semiconductor light-emitting device suitable for emission of ultraviolet light, blue light, or white light, and a method of manufacturing the same.

BACKGROUND TECHNOLOGY

Zinc oxide (ZnO) is a direct transition semiconductor having a bandgap energy of about 3.4 eV and having a quite high exciton binding energy of 60 meV, and thus can realize a light-emitting device with a high efficiency and low power consumption. In addition, zinc oxide has characteristics such as a low raw material price and harmless to environment and human body and thus can provide a light-emitting device which is low in price and excellent in environmental properties.

However, ZnO is susceptible to have a defect of an oxygen vacancy and interstitial Zn atom, and has been regarded as difficult to form a p-type conductive layer, but many studies are under way to make ZnO p-type using nitrogen (N) as an acceptor impurity and fabricate a light emitting-device with a high efficiency using ZnO semiconductor.

The semiconductor light-emitting device using a ZnO single crystal substrate is disclosed, for example, in following Patent Documents 1, 2, and 3, and a method of manufacturing ZnO crystal into which nitrogen (N) is introduced, though on a sapphire substrate, and a method of manufacturing a ZnO LED are disclosed in Patent Document 4.

Patent Document 1: JP 2004-247411A
Patent Document 2: JP 2004-247681A
Patent Document 3: JP 2004-296821A
Patent Document 4: JP 2004-221352A

DISCLOSURE OF THE INVENTION

Problems to be Solved by the Invention

However, as seen in Patent Document 4, the zinc oxide (ZnO) crystal (ZnO thin film) grown on a crystal substrate other than ZnO cannot form a thin film with a good crystallinity because of occurrence of defects and lattice distortion due to difference in crystal lattice constant and thermal expansion coefficient therebetween. Hence, it has been tried to form a ZnO buffer layer on a heterogeneous substrate and form a ZnO thin film on the ZnO buffer layer, but its crystallinity is still insufficient.

On the other hand, the ZnO bulk single crystal substrate excellent in crystallinity has been developed in recent years, but a ZnO buffer layer for improvement in crystallinity is formed on the ZnO single crystal substrate and a p-type layer is formed on the ZnO buffer layer in any of the semiconductor light-emitting devices using the ZnO single crystal substrate as seen in Patent Documents 1 to 3.

FIG. 10 and FIG. 11 are schematic cross-sectional views showing examples of conventionally proposed semiconductor light-emitting devices. In each of them, a buffer layer 101 of an n-type ZnO thin film is formed on a ZnO bulk single crystal substrate 100 for improvement in crystallinity, and a p-type ZnO thin film 102 doped with nitrogen is formed as the p-type layer on the buffer layer 101 to form a pn junction, and a first electrode (p-type ohmic electrode) 103 is formed on the p-type ZnO thin film 102.

In the example shown in FIG. 10, a second electrode (n-type ohmic electrode) 104 is formed on the n-type ZnO thin film, whereas in the example shown in FIG. 11, a second electrode (n-type ohmic electrode) 104 is formed on the rear surface side of the ZnO bulk single crystal substrate 100.

However, the formation of the p-type ZnO thin film is very difficult also in the above configuration, and only a few case of successful light emission has been reported. Furthermore, there has been no case reported in which a p-type thin film is formed directly on an n-type ZnO bulk single crystal substrate.

The invention has been developed in consideration of the above circumstances and has an object to provide a semiconductor light-emitting device which is excellent in mass productivity and presents sufficient light emission output as well as low price and excellent environmental properties by securely forming a p-type layer of ZnO with a high quality on an n-type ZnO bulk single crystal substrate, and a manufacturing method thereof.

Means for Solving the Problems

To attain the above object, a semiconductor light-emitting device according to the invention is characterized in that a pn junction is formed by forming, as a p-type layer, a semiconductor thin film which is composed of a ZnO compound doped with nitrogen on an n-type ZnO bulk single crystal substrate whose resistance is lowered by being doped with donor impurities.

The n-type ZnO bulk single crystal substrate is preferably lowered in resistance by being doped with $1.0 \times 10^{17}$ atoms/cm$^3$ or more of donor impurities composed of any one of Al, Fe, Ga, B, and In or combination thereof.

Preferably, the n-type ZnO bulk single crystal substrate is thus made to have a resistivity of 0.5Ω·cm or less.

In these semiconductor light-emitting devices, it is preferable that the p-type layer is formed on a zinc atom containing surface which is thermodynamically stable of the ZnO bulk single crystal substrate.

The zinc atom containing surface may be any one of a c (0001) surface (Zn surface), an m (10-10) surface, and an a (11-20) surface.

In such as case, the deposition with good crystallinity is possible even when the surface orientation of the n-type ZnO bulk single crystal substrate is within ±1 degree with respect to any one of the c (0001) surface, the m (10-10) surface, and the a (11-20) surface.

In these semiconductor light-emitting devices, a nitrogen rich layer is formed in the p-type layer near a junction surface between the p-type layer and the n-type ZnO bulk single crystal substrate, thereby ensuring that the p-type layer is formed on the n-type ZnO bulk single crystal substrate even without a buffer layer therebetween.

Preferably, the concentration of nitrogen doped in the p-type layer ranges from $2 \times 10^{17}$ atoms/cm$^3$ to $1 \times 10^{21}$ atoms/cm$^3$.

As described above, in the semiconductor light-emitting device, the p-type layer can be directly formed on the n-type ZnO bulk single crystal substrate.

Further, it is more preferable that an n-type conduction control layer for controlling conductivity is formed between the n-type ZnO bulk single crystal substrate and the p-type layer.

A method of manufacturing a semiconductor light-emitting device according to the invention is a method of manufacturing the above-described semiconductor light-emitting device characterized in that the formation of the p-type layer on the n-type ZnO bulk single crystal substrate is performed by evaporating high purity zinc from a solid metal element source in a reduced-pressure chamber, and causing oxygen and nitrogen to react with the evaporated zinc on the n-type ZnO bulk single crystal substrate or on the way for the evaporated zinc to reach the substrate.

The method preferably includes, as pretreatment for forming the p-type layer: a step of annealing (heat treatment) for planarization on the n-type ZnO bulk single crystal substrate; a step of annealing for cleaning the n-type ZnO bulk single crystal substrate surface in a high vacuum in the reduced-pressure chamber; and a step of performing plasma treatment in a nitrogen atmosphere to perform planarization and cleaning of the n-type ZnO bulk single crystal substrate surface.

Preferably, in the formation of the p-type layer, a partial pressure ratio between the nitrogen and oxygen is set to 1:0.5 to 5.

The formation of the p-type layer on the n-type ZnO bulk single crystal substrate can also be performed by a reactive evaporation method assisted by plasma. Alternatively, the formation of the p-type layer can also be performed by a metal organic chemical vapor deposition (MOCVD) method, or by a molecular beam epitaxy (MBE) method using a metal zinc element source.

EFFECT OF THE INVENTION

The semiconductor light-emitting device according to the invention presents sufficient light emission output and is excellent in mass productivity as well as low in price and excellent in environmental properties because a p-type layer of ZnO with a high quality is formed on an n-type ZnO bulk single crystal substrate to form a pn junction.

With the method of manufacturing a semiconductor light-emitting device according to the invention, the semiconductor light-emitting device can be efficiently manufactured.

EXPLANATION OF CODES

| | |
|---|---|
| 1: | semiconductor light-emitting device |
| 10: | n-type ZnO bulk single crystal substrate |
| 11: | p-type layer (p-type nitrogen doped ZnO film) |
| 11a: | nitrogen rich layer |
| 12: | first electrode (p-type ohmic electrode) |
| 13: | second electrode (n-type ohmic electrode) |
| 15: | junction surface (interface) |
| 20: | bell jar (reduced-pressure chamber) |
| 21: | gas supply port |
| 22: | exhaust port |
| 23: | substrate mask |
| 24: | support member |
| 25: | substrate heating heater |
| 26: | temperature sensor |
| 30: | crucible |
| 31: | crucible heating heater |
| 32: | temperature sensor |
| 33: | shutter |
| 35, 36: | electrode terminal |
| 40: | plasma generating coil |

BEST MODE FOR CARRYING OUT THE INVENTION

Hereinafter, preferred embodiments for embodying the invention will be described.

Embodiments of Semiconductor Light-Emitting Device

Figure 1:
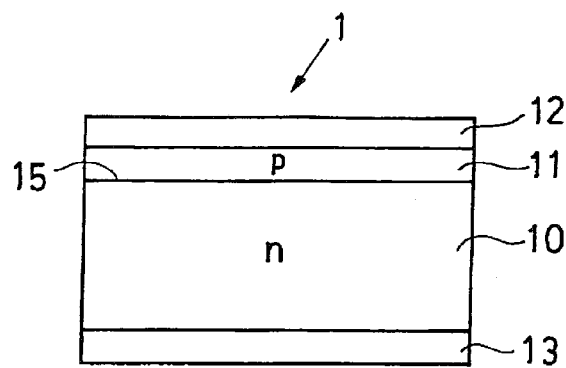
FIG. 1 is a schematic cross-sectional view showing an embodiment of a semiconductor light-emitting device according to the invention

FIG. 1 is a schematic cross-sectional view showing an embodiment of a semiconductor light-emitting device according to the invention.

In this semiconductor light-emitting device 1, a semiconductor thin film (p-type nitrogen doped ZnO film) which is composed of ZnO compound doped with nitrogen is formed as a p-type layer 11, on an n-type ZnO bulk single crystal substrate 10 whose resistance is lowered by being doped with donor impurities, so that they form a pn junction at a junction surface (interface) 15. The p-type layer 11 is formed directly on the n-type ZnO bulk single crystal substrate 10 through epitaxial growth in which crystals grow according to its lattice information.

A p-type ohmic electrode is then formed on the p-type layer 11 as a first electrode 12, and an n-type ohmic electrode is formed on the rear surface of the n-type ZnO bulk single crystal substrate 10 as a second electrode 13, respectively.

The n-type ZnO bulk single crystal substrate 10 has a resistivity of $0.5\Omega\cdot cm$ or less by being doped with $1.0\times10^{17}$ atoms/$cm^3$ or more of donor impurities composed of any one of Al, Fe, Ga, B, and In or combination thereof when a ZnO single crystal is grown.

This could suppress the increase corresponding to the series resistance and thus greatly improve the properties of the pn junction and light emission.

Further, focusing attention on the fact that the surface state densities of a zinc surface (Zn surface) of a c surface, an m (10-10) surface and a (11-20) surface of the ZnO single crystal substrate are less than that of an oxygen surface (O surface) of the c surface, and that the c (0001) surface, the m (10-10) surface and the a (11-20) surface which are zinc atom containing surfaces of the ZnO single crystal are thermodynamically stable, a p-type layer 11 composed of a ZnO thin film made by doping any one of these surfaces with nitrogen has been formed.

Figure 2A:
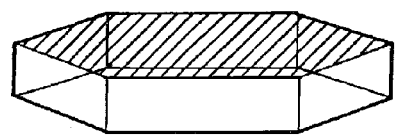
FIG. 2A, FIG. 2B, and FIG. 2C are explanatory views of zinc atom containing surfaces of an n-type ZnO bulk singe crystal.
Figure 2B:
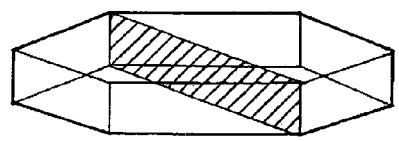
Figure 2C:
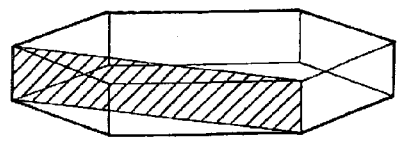

These zinc atom containing surfaces of the ZnO single crystal are schematically shown in FIGS. 2A to 2C, FIG. 2A showing the c (0001) surface (Zn surface), FIG. 2B showing the m (10-10) surface, and FIG. 2C showing the a (11-20) surface, respectively with hatchings.

However, if the surface orientation of the n-type ZnO bulk singe crystal substrate 10 is within ±1 degree respectively with respect to the c (0001) surface, the m (10-10) surface, and the a (11-20) surface, deposition with a good crystallinity is possible up to such angles even when a surface containing steps appears as well as when there is a wide flat area which is called terrace with no or little projections and depressions.

Figure 3:
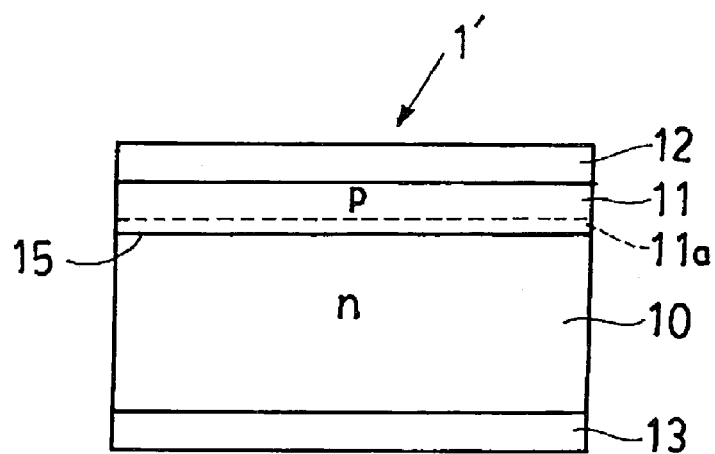
FIG. 3 is a schematic cross-sectional view showing a more preferable embodiment of a semiconductor light-emitting device according to the invention.

FIG. 3 is a schematic cross-sectional view showing a more preferable embodiment of the semiconductor light-emitting device according to the invention. The semiconductor light-emitting device 1' of this embodiment essentially has the same configuration as that of the previously described semiconductor light-emitting device 1, but the p-type layer 11 composed of the ZnO semiconductor thin film doped with nitrogen directly formed on the n-type ZnO bulk single crystal substrate 10 has a nitrogen rich layer 11a formed on the n-type ZnO bulk single crystal substrate 10 side.

Figure 4:
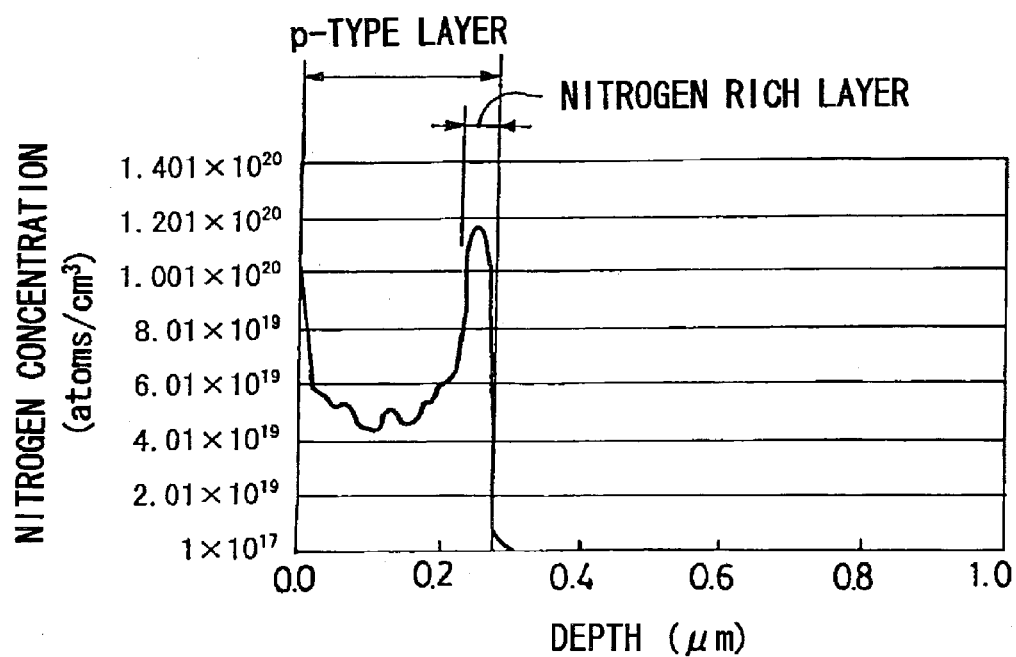
FIG. 4 is a diagram showing the nitrogen concentration in a p-type layer by the secondary ion mass spectrometer (SIMS) with respect to the depth from the front surface.

FIG. 4 is a diagram showing the nitrogen concentration in the p-type layer 11 analyzed by a secondary ion mass spectrometer (SIMS) with respect to the depth from the front surface. The thickness of the p-type layer 11 composed of the ZnO semiconductor thin film doped with nitrogen is about 0.3 μm, and forms the nitrogen rich layer 11a within about 0.05 μm from the interface with the n-type ZnO bulk single crystal substrate 10.

This ensures that the p-type layer 11 composed of a ZnO semiconductor thin film with a high quality is formed directly on the n-type ZnO bulk single crystal substrate 10.

However, to make the properties of the pn junction much better, it is also effective to provide an n-type conduction control layer for controlling the conductivity between the n-type ZnO bulk single crystal substrate 10 and the p-type layer 11.

Embodiments of Method of Manufacturing Semiconductor Light-Emitting Device

The reason why the buffer layer has been thus far required may be the existence of interface impurities on the ZnO single crystal substrate, and the growth of crystal defects and dislocation associated therewith in the thickness direction needs to be controlled by the buffer layer. However, this invention can eliminate the use of the buffer layer by performing, as pretreatment for forming the p-type layer on the n-type ZnO bulk single crystal substrate, the step of annealing for planarization on the n-type ZnO bulk single crystal substrate 10; the step of annealing for cleaning the n-type ZnO bulk single crystal substrate surface in a high vacuum in a reduced-pressure chamber; and the step of performing plasma treatment in a nitrogen atmosphere to perform planarization and cleaning of the n-type ZnO bulk single crystal substrate surface, and can form the nitrogen rich layer 11a in the p-type layer 11 in the plasma treatment in the nitrogen atmosphere.

The formation of the nitrogen rich layer is also possible by annealing under a nitrogen atmosphere (the thermal diffusion method), or a nitriding process of ionizing impurities and implanting them by irradiation using beams (the ion implantation method), other than by the treatment with the nitrogen plasma in a later-described embodiment. The concentration of nitrogen to be doped was set to be within a range from $2\times10^{17}$ atoms/cm$^3$ to $1\times10^{21}$ atoms/cm$^3$. When the concentration is $2\times10^{17}$ atoms/cm$^3$ or less, the resistance of the p-type layer is increased to degrade the light-emitting efficiency. When the concentration exceeds $1\times10^{21}$ atoms/cm$^3$, the crystallinity will degrade.

Embodiments

Figure 5:
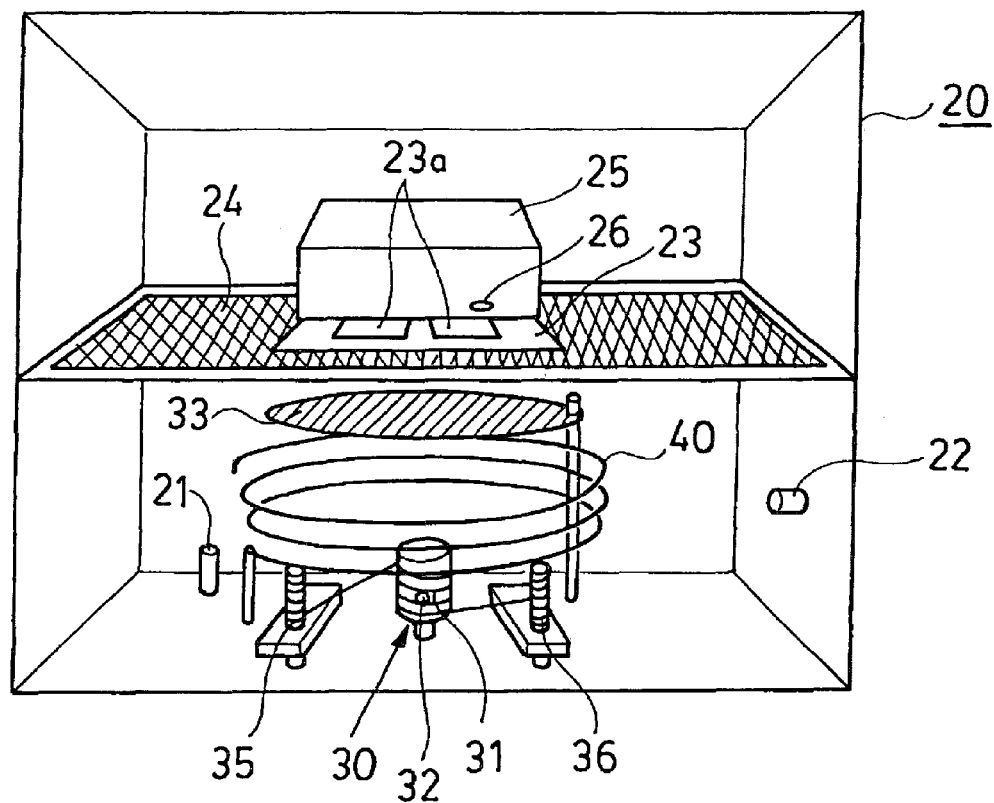
FIG. 5 is a schematic perspective view showing a configuration example of a ZnO thin film growth system used for manufacturing the semiconductor light-emitting device according to the invention.

FIG. 5 shows a crystal growth system (hereinafter, referred to as a "reactive evaporation system") using a reactive evaporation method assisted by plasma as an example of a ZnO thin film growth system using a method of manufacturing the semiconductor light-emitting device according to the invention.

The reactive evaporation system includes a bell jar 20 that is a reduced-pressure chamber, a not-shown gas supply apparatus for introducing oxygen and nitrogen thereinto, and a vacuum pump for bringing the inside of the bell jar 20 into a vacuum state. Penetrating through the wall surface of the bell jar 20, a gas supply port 21 for introducing oxygen and nitrogen and an exhaust port 22 for exhausting gas by the vacuum pump are provided.

In the bell jar 20, a dedicated substrate mask 23 for holding the n-type ZnO bulk single crystal substrate being a base of thin film growth is supported by an almost horizontal support member 24 in a mesh form. A heater 25 for heating the substrate is attached to the top of the substrate mask 23, and the heater 25 includes a temperature sensor 26 for checking the heating temperature.

Under the substrate mask 23 in the bell jar, a crucible 30 for supplying zinc (Zn) is provided which includes a heater 31 for heating and evaporating zinc Zn and a temperature sensor 32 for checking the heating temperature, and a pivotable shutter 33 is provided between the substrate mask 23 and the crucible 30. Numerals 35 and 36 denote electrode terminals for feeding power to the heater 31. Between the crucible 30 and the shutter 33, a plasma generating coil 40 is further provided.

Figure 6:
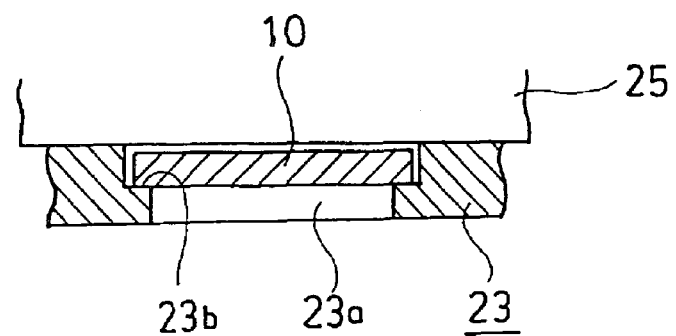
FIG. 6 is an enlarged cross-sectional view of an n-type ZnO bulk single crystal substrate setting portion of the same.

In the substrate mask 23, a plurality of window holes 23a provided with a stepped portion 23b are formed as shown enlarged in FIG. 6, and the n-type ZnO bulk single crystal substrate 10 is placed in each of the window holes 23a by locking its outer peripheral portion on the step portion 23b.

The inside of the bell jar 20 is kept in a vacuum state by the not-shown pump during the formation of a thin film. The growth of a thin film, the degree of vacuum and so on in the bell jar 20 is appropriately controlled by a not-shown control panel. Further, the output and so on of the plasma generating coil 40 are similarly appropriately controlled by the control panel.

Hereinafter, the process of forming the ZnO thin film on the n-type bulk single crystal substrate will be described in detail.

First of all, the n-type ZnO bulk signal crystal substrate is located in a not-shown electric furnace for annealing and heated at 800° C. to 1000° C. for 2H (hours), whereby its surface is subjected to planarization treatment. If the temperature of this annealing is lower than 800° C., the planarization is not sufficiently performed, whereas if it exceeds 1000° C., Zn and O atoms escape to cause defects.

Subsequently, the n-type ZnO bulk single crystal substrate 10 is set such that its zinc surface appears as a lower-surface shown in FIG. 6 at a predetermined position of the substrate mask 23 in the bell jar 20 shown in FIG. 5 of the reactive evaporation system. A fixed amount of metal zinc having a size of 2 mm to 5 mm and a purity of 99.9999% or higher is filled in the crucible 30. A metal zinc having a purity less than the above-mentioned is unusable because of a greater impurity concentration to cause deterioration of the electric property and crystallinity of the ZnO thin film.

Thereafter, the bell jar 20 of the reactive evaporation system is evacuated to the extent of $(1.0 \text{ to } 2.0) \times 10^{-4}$ Pa through the exhaust port 22 by the not-shown vacuum pump. A low degree of vacuum leads to a high content rate of impurities in the deposited film. After confirmation of the vacuum state, the power of the substrate heating heater 25 is turned on to heat the substrate at 500° C. to 700° C. for 0.5H to 1 H (hour) to thereby perform annealing for cleaning the front surface of the n-type ZnO bulk single crystal substrate 10. If the temperature is lower than 500° C. or the annealing time is shorter than 0.5H in this event, the cleaning is insufficient, whereas if the temperature is higher than 700° C. or the annealing time is longer than 1H, zinc (Zn) and oxygen (O) atoms escape to increase defects.

A nitrogen gas is then introduced from the gas supply port, and an RF voltage is applied across the plasma generating coil 40 under an inner pressure of the bell jar 20 of $8.0 \times 10^{-1}$ Pa to activate it to generate plasma. For the nitrogen gas to be introduced, a cylinder gas at a grade of G3 or higher (purity of 99.99% or higher) is used. A gas at a grade lower than that cannot be used because the gas has an increased impurity concentration to deteriorate the electrical property and crystallinity of the ZnO thin film.

The inner pressure of the bell jar 20 of $8.0 \times 10^{-1}$ Pa is the pressure necessary to generate plasma in this embodiment. The plasma output is performed between 100 W and 300 W for 5 to 30 minutes for planarization treatment and cleaning for the front surface of the n-type ZnO bulk single crystal substrate 10 to thereby prepare for formation of a nitrogen rich layer in the formation of the p-type layer.

A plasma output less than 100 W or a treatment time shorter than 5 minutes decreases the effect of the treatment. On the other hand, a plasma output greater than 300 W or a treatment time longer than 30 minutes damages the substrate.

After completion of the cleaning, the heating temperature for the n-type ZnO bulk single crystal substrate 10 by the heater 25 is adjusted to a deposition temperature. The deposition temperature is set to a range from 300° C. to 650° C. If the deposition temperature is lower than 300° C., the crystallinity is significantly poor, whereas if the deposition temperature exceeds 650° C., deposition is impossible. After the adjustment of temperature, the power of the crucible heating heater 31 is turned on. The heating temperature of the crucible 30 is set to a range from 300° C. to 650° C. If the heating temperature is lower than 300° C., zinc (Zn) does not evaporate, whereas under the condition of the heating temperature higher than 650° C., the deposition rate is too high, resulting in significantly poor crystallinity.

Subsequently, an oxygen gas that is another raw material is introduced, and an RF voltage is applied across the plasma generating coil 40 to activate it to generate plasma. For the oxygen gas to be introduced, a cylinder gas at a grade of G3 or higher (purity of 99.99% or higher) is used. A gas at a grade lower than that cannot be used because the gas has an increased impurity concentration to deteriorate the electrical property and crystallinity of the ZnO thin film.

The plasma output is performed between 50 W and 250 W. If the plasma output is lower 50 W, deposition is impossible, whereas if the plasma output is higher than 250 W, the deposition rate is too high, resulting in significantly poor crystallinity of the ZnO thin film.

In this event, the nitrogen (cylinder gas) that is the doping material is introduced into the oxygen gas, and doping is performed. The oxygen and nitrogen are controlled in flow rate by a mass flow meter and adjusted to keep the inner pressure of the bell jar 20 to $6.0 \times 10^{-1}$ Pa to $8.0 \times 10^{-1}$ Pa. The reason to keep this pressure is that this pressure is the condition where the deposition rate is high and the crystallinity is good as well as the doping is smoothly performed. If the inner pressure is lower than $6.0 \times 10^{-1}$ Pa, oxygen and nitrogen are reduced to result in that zinc oxide (ZnO) is not efficiently prepared to fail to deposit a film or the doping amount is small to fail to present the characteristic of the p type. On the other hand, if the inner pressure is higher than $8.0 \times 10^{-1}$ Pa, zinc (Zn) that is the raw material is oxidized and hardly reacts.

The oxygen and nitrogen are brought to have partial pressures such as nitrogen:oxygen=1:0.5 to 5, and the shutter 33 over the crucible 30 is then opened to start deposition. The reason for the above-described partial pressure ratio is that a proportion of nitrogen higher than that deteriorates the crystallinity and, on the other hand, a proportion lower than that leads to a lower carrier concentration to increase the resistance of the p-type layer. The deposition time is set to 30 to 120 minutes, and the film thickness is set to 0.2 μm to 2.0 μm. The deposition time is time necessary to obtain this film thickness.

In this way, the formation of the p-type layer 11 on the n-type ZnO bulk single crystal substrate 10 is performed by evaporating high purity zinc from the crucible 30 that is a solid metal element source in the bell jar 20, and causing oxygen and nitrogen to react with the zinc on the n-type ZnO bulk single substrate 1 or on the way for the evaporated zinc to reach the substrate 10.

After completion of the deposition time, the shutter 33 is closed, the heating of the crucible 30 and the n-type ZnO bulk single crystal substrate 10 is stopped, the plasma power supply is also turned off, and the introduction of the oxygen gas and the nitrogen gas is stopped. After the n-type ZnO bulk single crystal substrate 10 and the crucible 30 drop in temperature, a sample (in which the p-type layer 11 is formed on the n-type ZnO bulk single crystal substrate 10) is taken out.

The fabrication of the first electrode 12 and the second electrode 13 shown in FIG. 1 and FIG. 3 is performed by a vacuum evaporation system with the deposited sample being attached to a mask dedicated to electrode fabrication. On the rear surface of the n-type ZnO bulk single crystal substrate 10, aluminum Al is deposited to 0.2 μm to 0.5 μm to form the second electrode (n-type ohmic electrode) 13. The reason for this thickness is that this is enough to obtain ohmic contact and to obtain enough strength of the electrode.

On the p-type layer 11 composed of the ZnO thin film doped with nitrogen, nickel Ni is deposited to 0.008 μm, and gold Au is deposited to 0.2 μm to 0.3 μm to form the first electrode (p-type ohmic electrode). Ni is first deposited to impart adhesion, and Au is subsequently deposited to obtain sufficient ohmic contact and the strength as the electrode. The electrode size is set to $1 \times 1$ mm$^2$.

The semiconductor light-emitting device according to the invention fabricated under the above-described condition was evaluated.

Figure 7:
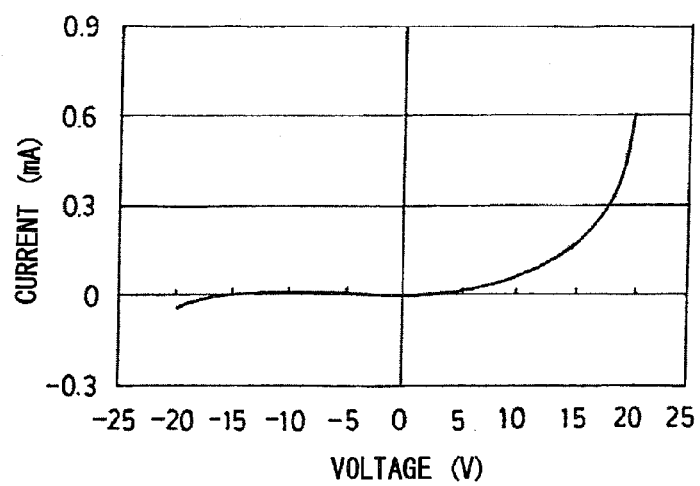
FIG. 7 is a diagram showing a measurement example of the I-V characteristics of the semiconductor light-emitting device according to the invention.

FIG. 7 is a diagram showing the I-V (current-voltage) characteristics. As a result of measuring at room temperature of 15° C. to 20° C., excellent rectification property was obtained.

Figure 8:
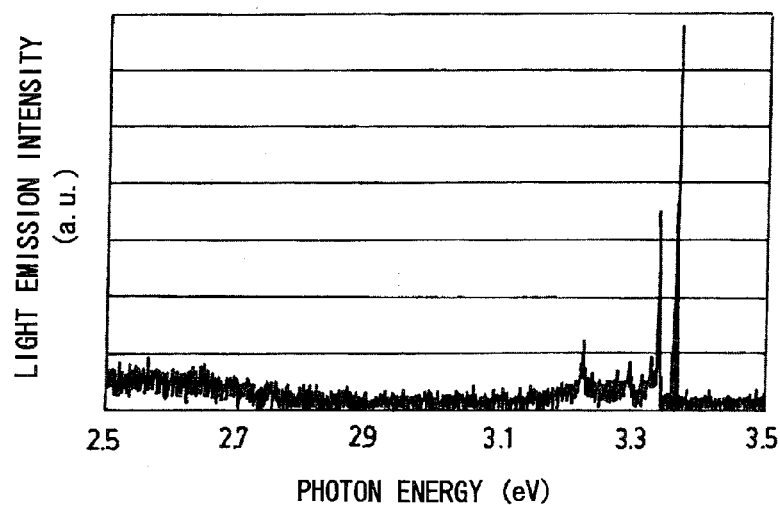
FIG. 8 is a diagram showing the photoluminescence (PL) spectrum of the semiconductor light-emitting device according to the invention.

FIG. 8 is a diagram showing the photoluminescence (PL) spectrum. The horizontal axis shows photon energy (eV), and the light emission wavelength is 1.24/eV (μm). The vertical axis shows the light emission intensity (a.u.). The a.u. means arbitrary unit indicating the relative magnitude of the light emission intensity. The measurement was carried out under the measurement condition of temperature: 4K, slit width: 0.1 mm, exposure time: 600 msec, and excitation light source: He—Cd laser (325 nm, 20 mW) using Photoluminor-U manufactured by Horiba Ltd.

As can be seen from FIG. 8, sharp peaks were observed at photon energies of 3.359 eV and 3.331 eV. The peak at 3.359 eV is considered due to D°X (neutral donor bound exciton emission) that is the peak showing the n-type conductivity and is sharp because of good crystallinity. The peak at 3.331 eV is the peak derived from nitrogen due to the conductivity of p-type.

Figure 9:
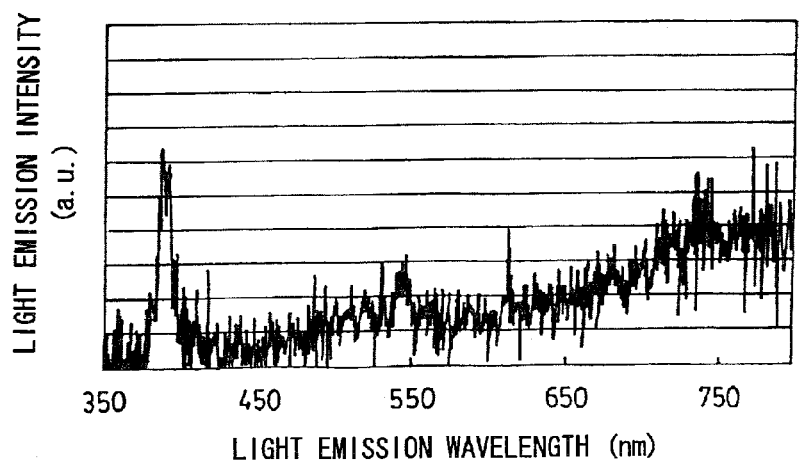
FIG. 9 is a diagram showing the light emission wavelength-light emission intensity spectrum of the semiconductor light-emitting device according to the invention.
Figure 10:
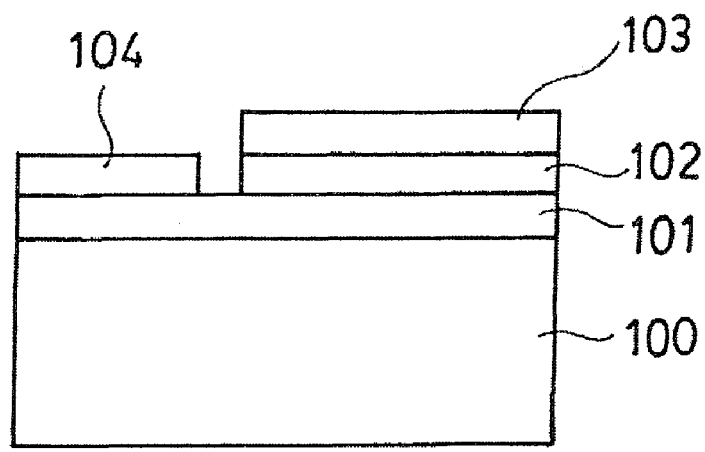
FIG. 10 is a schematic cross-sectional view showing an example of a conventionally proposed semiconductor light-emitting device.
Figure 11:
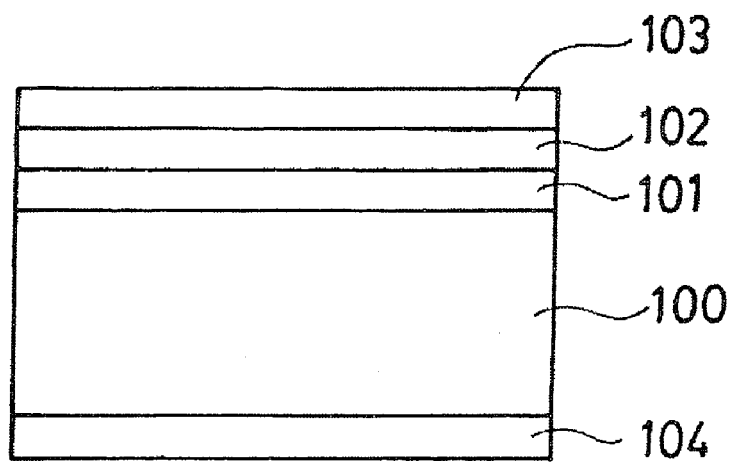
FIG. 11 is a schematic cross-sectional view showing another example of a conventionally proposed semiconductor light-emitting device.

FIG. 9 shows the EL spectrum showing the relation between the light emission wavelength (nm) and the light emission intensity (a.u.) when a current is passed between the first electrode 12 and the second electrode 13 of the semiconductor light-emitting device 1' shown in FIG. 3.

The measurement was carried out under the measurement condition of temperature: 15° C. to 20° C., exposure time: 30 sec, and application voltage: 35 V using PHOTONIC MULTI-CHANNEL ANALYZER manufactured by Hamamatsu Photonics KK.

The above-described embodiment has been described in detail for an example of a case where the formation of the p-type layer on the n-type ZnO bulk single crystal substrate is performed by the reactive evaporation method assisted by plasma. However, the invention is not limited to that, but the above-described formation of the p-type layer on the n-type ZnO bulk single crystal substrate is also possible by the metal organic chemical vapor deposition (MOCVD) method in which the pretreatment, deposition method, and various parameters have been adjusted and improved from a viewpoint similar to the above-described reactive deposition method assisted by plasma, or the molecular beam epitaxy (MBE) method using a metal zinc element source.

INDUSTRIAL APPLICABILITY

The invention provides a semiconductor light-emitting device which is excellent in mass productivity and presents sufficient light emission output as well as low price and excellent environmental properties by securely forming a p-type layer of ZnO with a high quality on an n-type ZnO bulk single crystal substrate, and a manufacturing method thereof. The semiconductor light-emitting device can be used for wide range of applications such as light-emitting diode, semiconductor laser device, and various kinds of display devices and printers using them, general illumination, light for automobile, and traffic signal. Further, the invention can also be utilized in the biotechnology field such as control of growing bacteria and crops.

What is claimed is:

1. A semiconductor light-emitting device in which a pn junction is formed by forming, as a p-type layer, a semiconductor thin film which is composed of a ZnO compound doped with nitrogen directly on an n-type ZnO bulk single crystal substrate whose resistance is lowered by being doped with donor impurities, wherein said n-type ZnO bulk single crystal substrate has a resistivity of 0.5 Ω·cm or less.

2. The semiconductor light-emitting device according to claim 1, wherein a surface on which said p-type layer of said ZnO bulk single crystal substrate is formed is a zinc atom containing surface.

3. A semiconductor light-emitting device in which a pn junction is formed by forming, as a p-type layer, a semiconductor thin film which is composed of a ZnO compound doped with nitrogen directly on an n-type ZnO bulk single crystal substrate whose resistance is lowered by being doped with donor impurities, wherein said n-type ZnO bulk single crystal substrate is lowered in resistance by being doped with $1.0 \times 10^{17}$ atoms/cm$^3$ or more of donor impurities composed of any one of Al, Fe, Ga, B, and In or combination thereof.

4. A semiconductor light-emitting device in which a pn junction is formed by forming, as a p-type layer, a semiconductor thin film which is composed of a ZnO compound doped with nitrogen directly on an n-type ZnO bulk single crystal substrate whose resistance is lowered by being doped with donor impurities, wherein a surface on which said p-type layer of said ZnO bulk single crystal substrate is formed is a zinc atom containing surface; and wherein the zinc atom containing surface is any one of a c (0001) surface, an m (10-10) surface, and an a (11-20) surface.

5. The semiconductor light-emitting device according to claim 4, wherein a surface orientation of said n-type ZnO bulk singe crystal substrate is within ±1 degree with respect to any one of the c (0001) surface, the m (10-10) surface, and the a (11-20) surface.

6. A semiconductor light-emitting device in which a pn junction is formed by forming, as a p-type layer, a semiconductor thin film which is composed of a ZnO compound doped with nitrogen directly on an n-type ZnO bulk single crystal substrate whose resistance is lowered by being doped with donor impurities, wherein a nitrogen rich layer whose nitrogen concentration is higher than other part of said p-type layer is formed in said p-type layer near a junction surface between said p-type layer and said n-type ZnO bulk single crystal substrate.

7. A semiconductor light-emitting device in which a pn junction is formed by forming, as a p-type layer, a semiconductor thin film which is composed of a ZnO compound doped with nitrogen directly on an n-type ZnO bulk single crystal substrate whose resistance is lowered by being doped with donor impurities, wherein a concentration of nitrogen doped in said p-type layer ranges from $2 \times 10^{17}$ atoms/cm$^3$ to $1 \times 10^{21}$ atoms/cm$^3$.

* * * * *